United States Patent [19]

Li

[11] Patent Number: 6,146,151
[45] Date of Patent: Nov. 14, 2000

[54] METHOD FOR FORMING AN ELECTRICAL CONNECTOR AND AN ELECTRICAL CONNECTOR OBTAINED BY THE METHOD

[75] Inventor: Yu-Sung Li, Yung-Ho, Taiwan

[73] Assignee: Hon Hai Precision Ind. Co., Ltd., Taipei Hsien, Taiwan

[21] Appl. No.: 09/377,367

[22] Filed: Aug. 18, 1999

[51] Int. Cl.$^7$ .................................................... H01R 9/09
[52] U.S. Cl. .......................................................... 439/66
[58] Field of Search ................................. 439/66, 91

[56] References Cited

U.S. PATENT DOCUMENTS

| | | | |
|---|---|---|---|
| 4,927,369 | 5/1990 | Grabbe et al. | 439/66 |
| 5,139,427 | 8/1992 | Boyd et al. | 439/66 |
| 5,228,861 | 7/1993 | Grabbe et al. | 439/66 |
| 5,427,535 | 6/1995 | Sinclair | 439/66 |
| 5,462,440 | 10/1995 | Rothenberger | 439/66 |
| 5,498,166 | 3/1996 | Rothenberger | 439/66 |
| 5,893,761 | 4/1999 | Longueville | 439/66 |
| 5,904,580 | 5/1999 | Kozel et al. | 439/66 |

*Primary Examiner*—Gary F. Paumen
*Attorney, Agent, or Firm*—We Te Chung

[57] ABSTRACT

A method for forming an electrical connector, comprising the following steps:

stamping a flat metal sheet to obtain a number of blank contacts and connecting portions lying on the flat plane, the connecting portions electrically connecting the blank contacts together;

insert molding elastomeric material to top and bottom faces of the metal sheet wherein a number of openings are formed in the elastomeric material aligning with the blank contacts and the connecting portions; and applying a tool through the openings to act on the blank contacts and the connecting portions whereby the blank contacts are bent to extend over top and bottom faces of the elastomeric material so that contacts for engaging with mating electrical components are formed, and the connecting portions are separated from the contacts so that the contacts are electrically individual from each other.

5 Claims, 6 Drawing Sheets

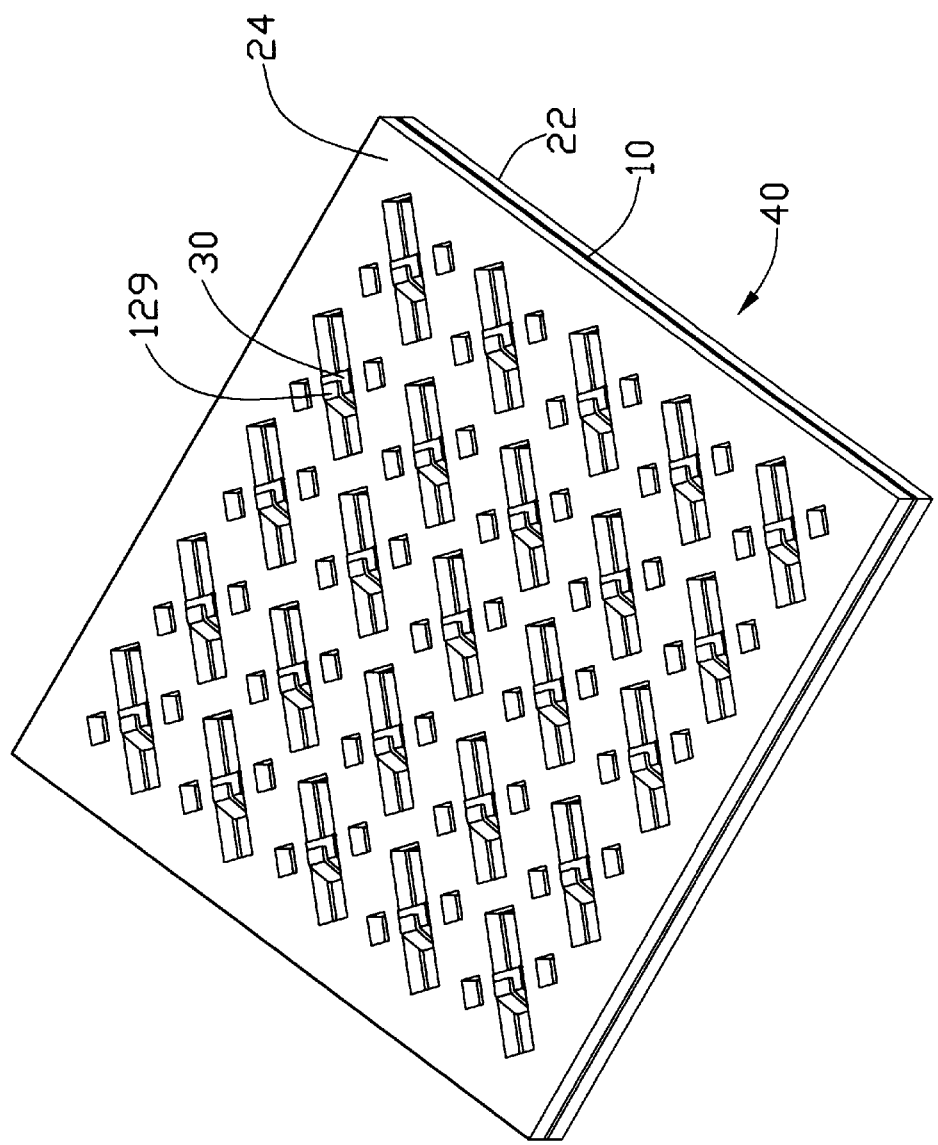

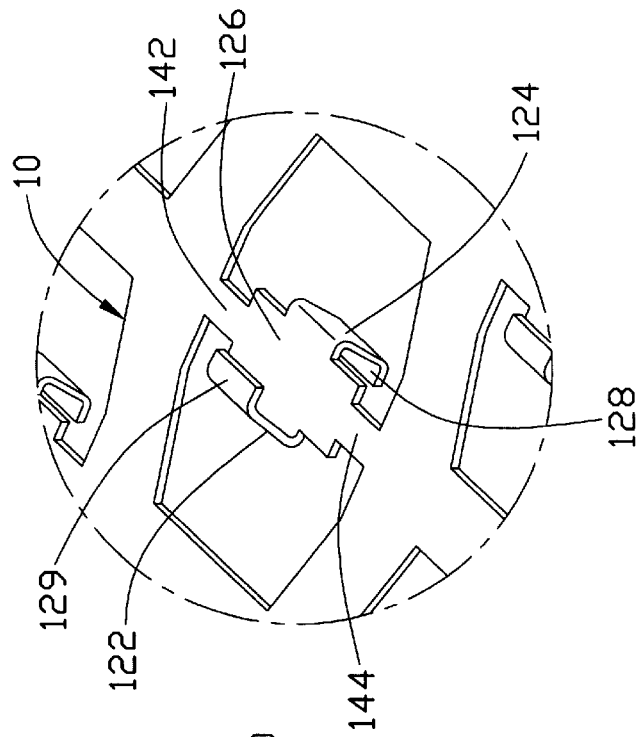
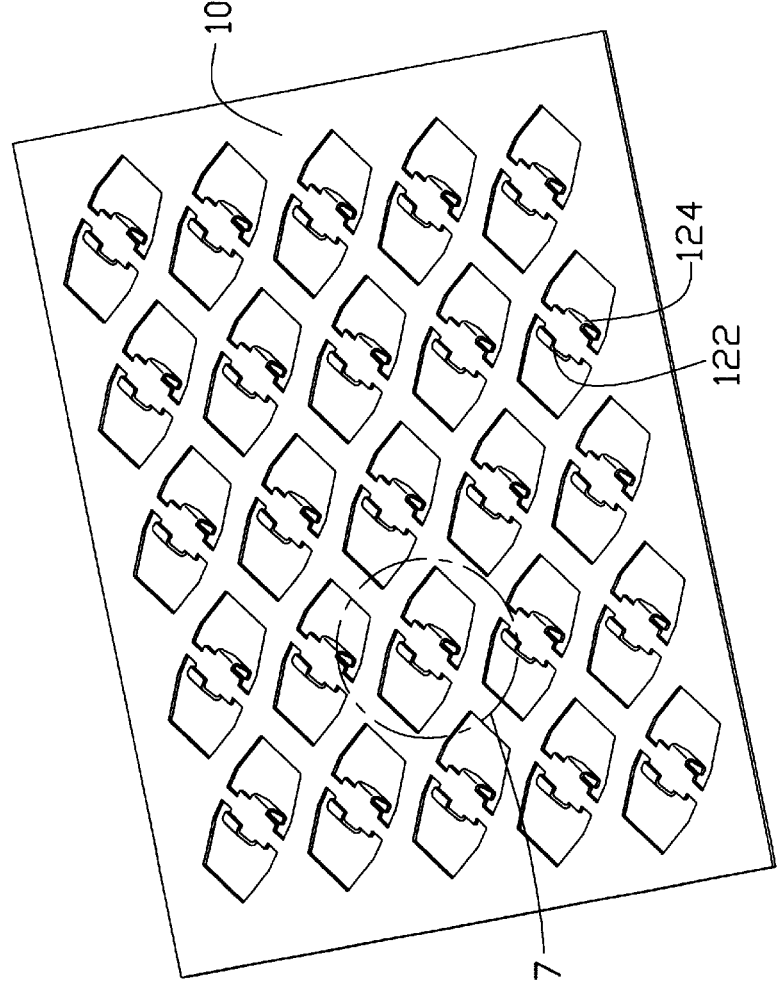
FIG.7
FIG.6

METHOD FOR FORMING AN ELECTRICAL CONNECTOR AND AN ELECTRICAL CONNECTOR OBTAINED BY THE METHOD

BACKGROUND OF THE INVENTION

Field of the Invention

The present invention is related to a method for forming an electrical connector (particularly a Land Grid Array (LGA) electrical connector), and an electrical connector obtained by the method.

An LGA connector has an advantage that it does not need any soldering process to connect it with mating electrical components. A compressing device is used to clamp the connector and mating electrical components together thereby forming an electrical connection therebetween.

Related prior arts concerning the LGA connector can be referred to U.S. Pat. Nos. 5,820,389, 5,395,252, 5,380,210, 4,793,814, and 5,324,205.

In these prior art patents, the connectors are formed by forming a dielectric housing and a number of contacts and then inserting the contacts into contact receiving holes of the housing. Such a manufacturing process is laborious which can not be automated; thus, the cost for the conventional connectors is high. Furthermore, as the housing is formed by rigid plastics which has a little flexibility, flatness of mating faces of the housing of the connector is critical for connection quality between the connector and mating electrical components.

Hence, an improved method for forming an LGA connector is needed to eliminate the above mentioned defects of current art.

SUMMARY OF THE INVENTION

Accordingly, an objective of the present invention is to provide a method for forming an LGA connector and an LGA connector obtained thereby, wherein the LGA connector can be made in an automatic manner so that the cost thereof can be lowered.

A further objective of the present invention is to provide a method for forming an LGA connector and an LGA connector obtained thereby, wherein contacts thereof can be selectively connected together to form a ground plane for the connector during the manufacturing thereof.

Still a further objective of the present invention is to provide a method for forming an LGA connector and an LGA connector obtained thereby, wherein the connector has a flexible housing so that flatness of the housing is not so critical for connection quality between the connector and mating electrical components.

To fulfill the above mentioned objectives, according to one embodiment of the present invention, an LGA connector is formed by the following steps.

A. Stamping a flat copper alloy sheet to obtain a number of blank contacts and connecting portions therein, the blank contacts and connecting portions lying on the flat plane, each blank contact having a pair of wings extending laterally from an elongate stem thereof, the connecting portions electrically connecting the blank contacts together;

B. Insert molding elastomeric material to the copper alloy sheet to sandwich the sheet, wherein the elastomeric material is formed with a number of first openings aligning with the wings, and a number of second wings aligning with the connecting portions, and a formation on a top and bottom face of each stem;

C. Applying a tool through the first openings to bend the wings to follow a contour of the corresponding formations to form contacts of the connector, wherein free ends of the wings are located respectively on top and bottom faces of the formations; and D. Applying a tool through the second openings to blank the connecting portions away from the metal sheet whereby the contacts are electrically individual from each other.

In a further embodiment, during step D, some connecting portions are selected not to be blanked away from the sheet so that the corresponding contacts are electrically connected with each other to form a ground plane for the connector.

BRIEF DESCRIPTION OF THE DRAWINGS

FIG. 4 is a bottom perspective view of the LGA connector of FIG. 3;

FIG. 6 is a bottom perspective view showing the contacts in the connector wherein the connecting portions are not blanked away;

FIG. 7 is a partially enlarged view of FIG. 6 showing the details of one of the contacts;

DETAILED DESCRIPTION OF THE PREFERRED EMBODIMENT

Reference will now be made in detail to the preferred embodiment of the present invention.

Figure 1:
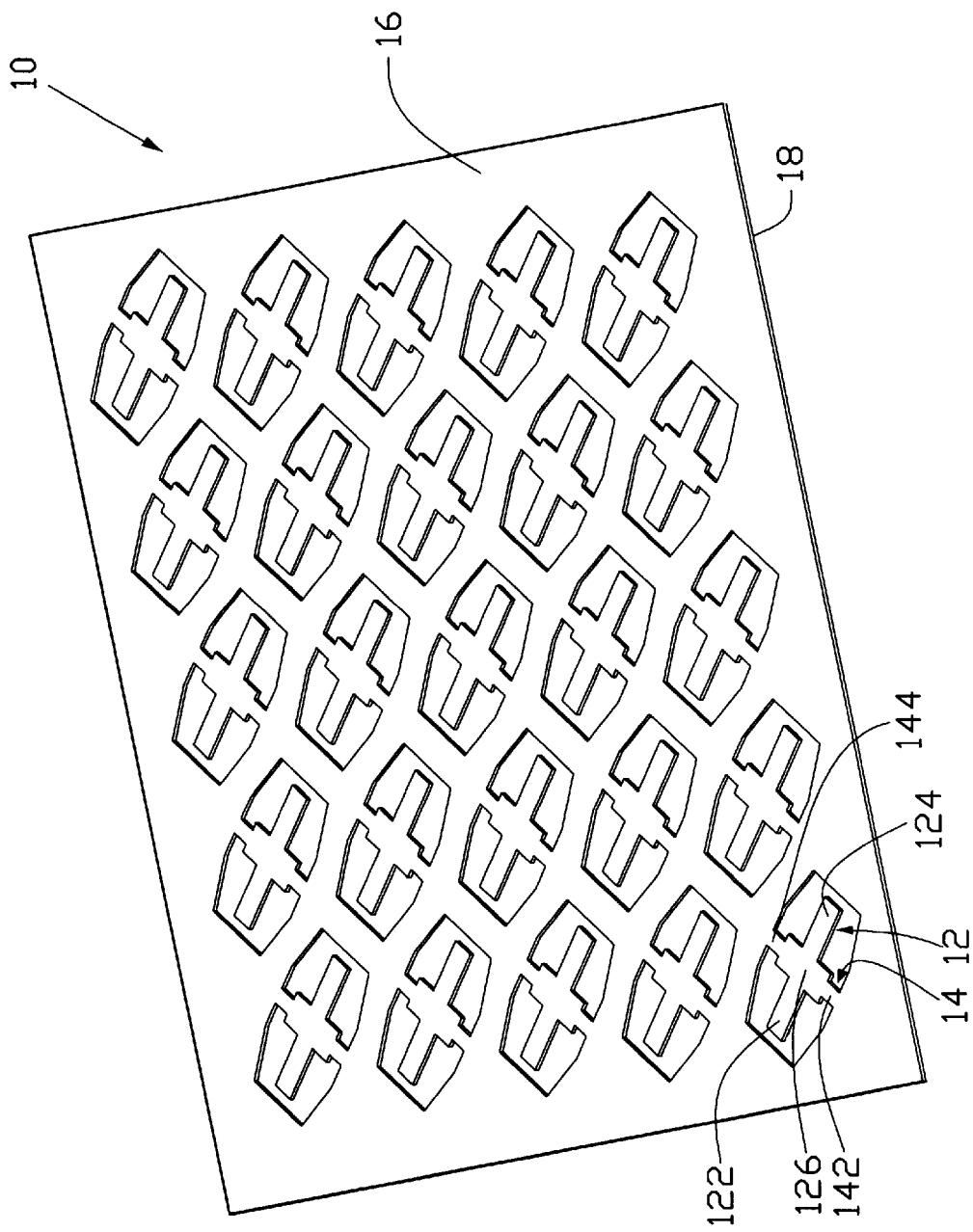
FIG. 1 is a perspective view showing a metal sheet stamped to form a number of blank contacts and connecting portions therein.

Referring to FIG. 1, to form an LGA connector in accordance with the present invention, firstly a flat metal sheet 10, preferably, a copper alloy sheet, is stamped to integrally form a number of blank contacts 12 and connecting portions 14 therein. The blank contacts 12 and connecting portions 14 lie on the same flat plane as the metal sheet 10. Each blank contact 12 comprises a pair of wings 122, 124 extending laterally in opposite directions from a central elongate stem 126 of the blank contact 12. Each connecting portion 14 comprises a lower tab 142 and an upper tab 144 connecting the metal sheet 10 with a corresponding stem 126 so that the blank contacts 12 are mechanically and electrically connected with each other. The lower and upper tabs 142, 144 are located beside longitudinal ends of the corresponding stem 126.

Figure 2:
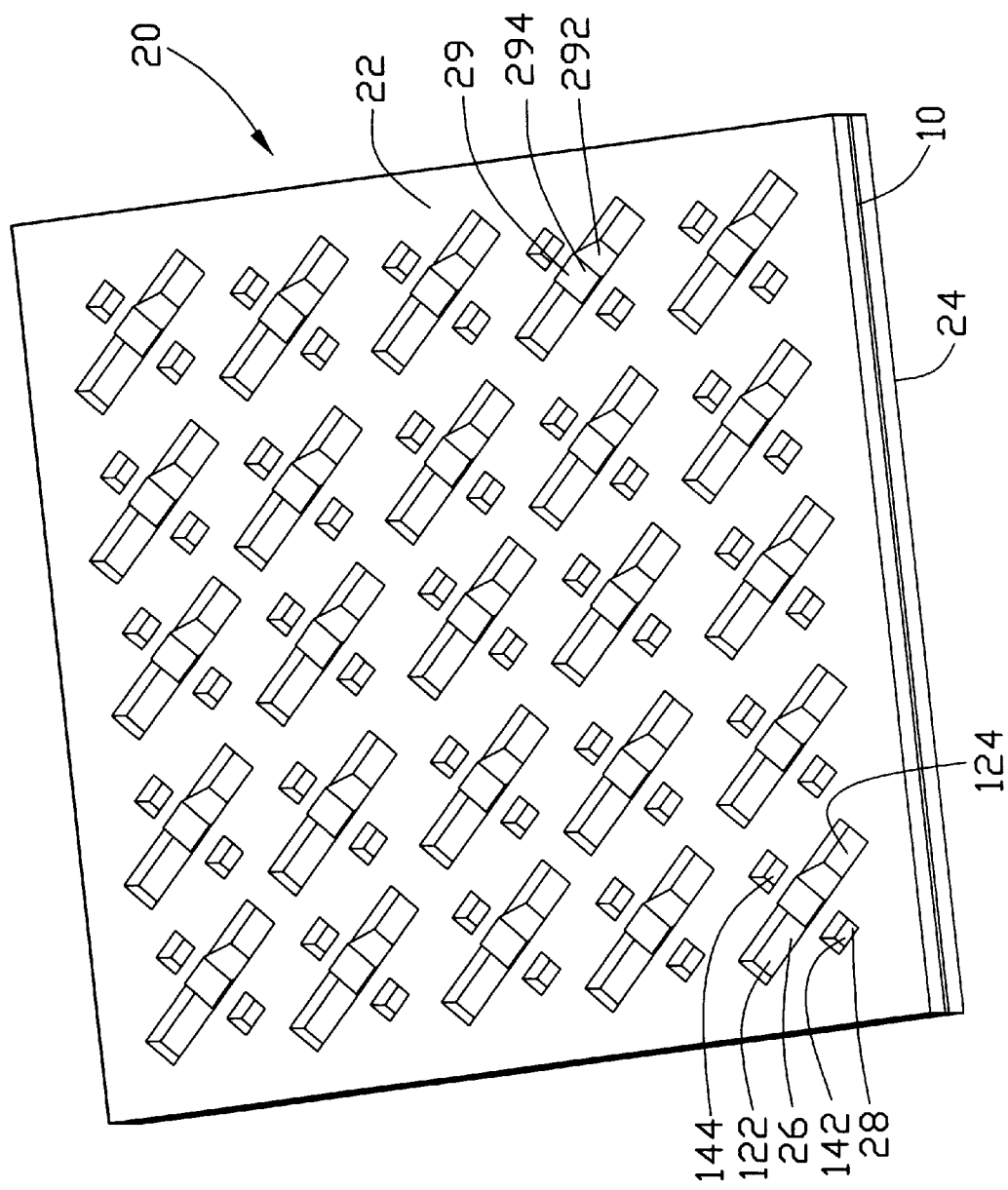
FIG. 2 is a perspective view showing elastomeric material being insert molded to the metal sheet of FIG. 1 to sandwich it.

Then, the metal sheet 10 is subject to an insert molding of elastomeric material (preferably, silicon rubber) to cover top and bottom faces 16 and 18 of the sheet 10 whereby the metal sheet 10 is sandwiched by the elastomeric material. Thus, a semi-finished product 20 is formed as shown in FIG. 2. The semi-finished product 20 includes the metal sheet 10, an upper elastomeric material layer 22 and a lower elastomeric material layer 24. The upper and lower layers 22, 24 each define a number of pairs of first openings 26 in alignment with the wings 122, 124 of the blank contacts 12, and a number of pairs of second openings 28 in alignment with the lower and upper tabs 142, 144 of the connecting portions 14. The first openings 26 have a size larger than that of the second openings 28.

The semi-finished product 20 is thereafter subject to a stamping operation, wherein a tool extends through the first openings 26 to bend the wings 122, 124 of the blank contacts 12. As shown in details in FIGS. 6, 7 and 8–10, each right wing 124 is bent upwardly to follow a contour of a formation 29 of the upper elastomeric material layer 22 formed on a top face of a corresponding stem 126. The formation 29 has an inclined side face 292 and a flat top face 294. A free end 128 of the right wing 124 is bent over the top face 294. Similarly, each left wing 122 is bent to follow a formation 30 of the lower elastomeric material layer 24 formed on a bottom face of a corresponding stem 126 so that a free end 129 of the left wing 122 is bent over a bottom face 32 of the formation 30. The bending operation causes the wings 122, 124 to become contacts of an LGA connector 40 in accordance with the present invention. The free ends 128 and 129 are used for engaging with mating electrical components to form an electrical connection therewith.

Although in the disclosed preferable embodiment, the elastomeric material is applied to the copper alloy sheet by insert molding, it is known by persons skilled in the art that the elastomeric material can be applied thereto by other methods. For example, the upper and lower elastomeric layers 22, 24 can be separately formed and then glued to the metal sheet 10 to sandwich it therebetween.

Figure 5:
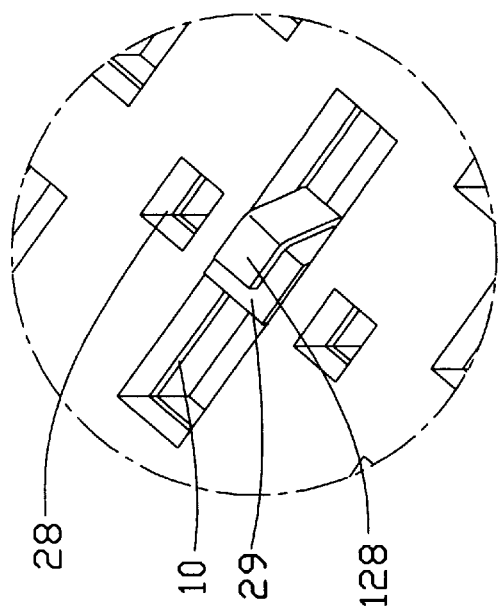
FIG. 5 is a partially enlarged perspective view of the LGA connector of FIG. 3.
Figure 3:
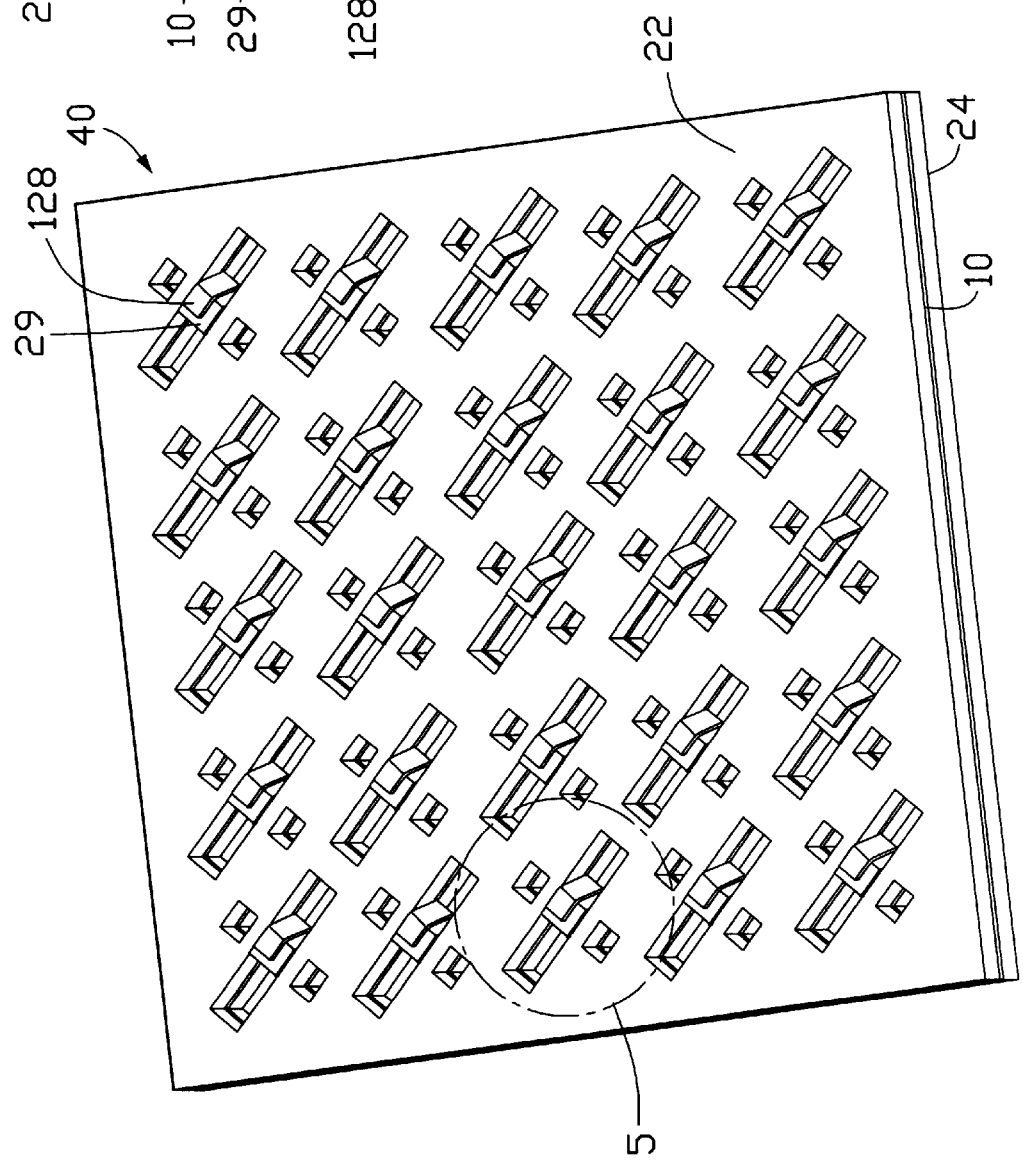
FIG. 3 is a top perspective view showing an LGA connector formed in accordance with the present invention.
Figure 10:
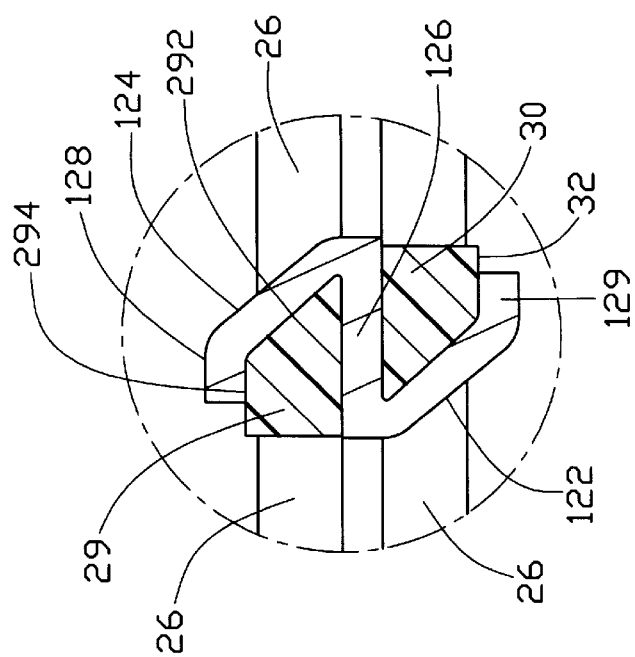
FIG. 10 is a partially enlarged view of a portion of FIG. 9 as indicated by a circle thereof.
Figure 8:
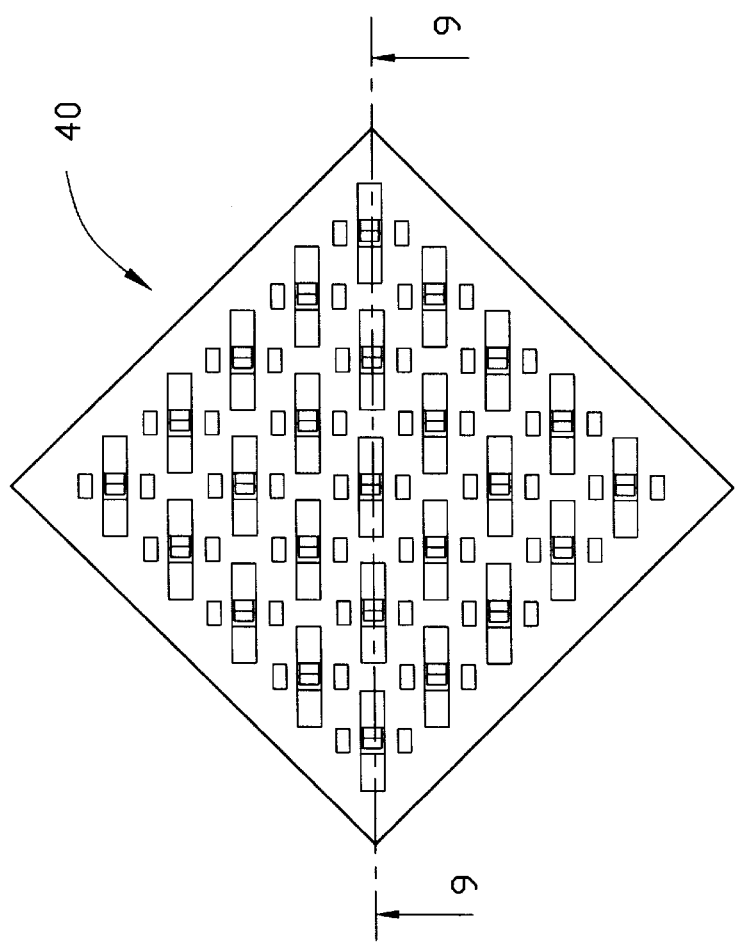
FIG. 8 is a diagrammatic top view of the connector of FIG. 3.
Figure 9:
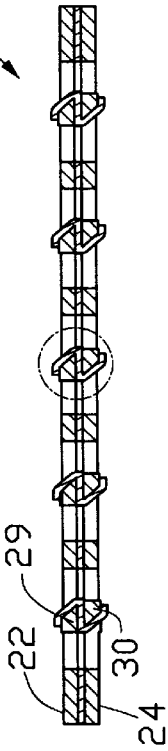
FIG. 9 is a cross-sectional view taken alone line 9—9 of FIG. 8.

Finally, as shown in details in FIG. 5, a blanking operation is applied to the semi-finished product 20 by extending a tool through the second openings 28 to remove the upper and lower tabs 142, 144 of the connecting portions 14 from the metal sheet 10, whereby the contacts are electrically individual from each other. With the blanking operation, the process for forming the LGA connector 40 in accordance with the present invention is completed.

On the other hand, the blanking operation can select not to remove some of the connecting portions 14 from the metal sheet 10 thereby making the corresponding contacts electrically connect with each other. These interconnected contacts are used as a ground plane for the electrical connector 40.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. An electrical connector, comprising:

a number of contacts arranged in a grid array;

an elastomeric housing having the contacts embedded therein;

each contact having a pair of lateral wings connected to a central elongate stem, the wings extending to follow a contour of a respective formation located on top and bottom faces of each stem, the formations being integrally molded with the housing free ends of the wings extending over engaging top and bottom faces of the respective formation for electrically engaging with mating electrical components, the housing defining a number of first through openings beside the wings, respectively, and a number of second through openings beside longitudinal ends of the stems, respectively.

2. The electrical connector in accordance with claim 1, wherein each formation on the top face of the corresponding stem has an inclined side face and a flat top face, and each formation on the bottom face of the corresponding stem has an inclined side face and a flat bottom face.

3. The electrical connector in accordance with claim 1, wherein the flexible housing is inserted molded to the contacts.

4. The electrical connector in accordance with claim 1, wherein the flexible housing comprises upper and lower layers which are connected with each other by gluing, the contacts being sandwiched between the upper and lower layers of the housing.

5. The electrical connector in accordance with claim 1, wherein some of the contacts are electrically connected with each other to function as a ground plane for the connector.

* * * * *